United States Patent [19]
Takeuchi et al.

[11] Patent Number: 5,907,260
[45] Date of Patent: May 25, 1999

[54] DIFFERENTIAL AMPLIFYING CIRCUIT

[75] Inventors: Masaru Takeuchi; Yukihiro Terada, both of Atsugi, Japan

[73] Assignee: Mitsumi Electric Co., Ltd., Tokyo, Japan

[21] Appl. No.: 08/901,151

[22] Filed: Jul. 28, 1997

[30] Foreign Application Priority Data

Jul. 31, 1996 [JP] Japan ................................. 8-202576

[51] Int. Cl.$^6$ ..................................................... H03F 3/45
[52] U.S. Cl. .......................................... 330/252; 330/261
[58] Field of Search .................. 330/252, 261, 330/310, 311

[56] References Cited

U.S. PATENT DOCUMENTS

| | | | |
|---|---|---|---|
| 5,465,070 | 11/1995 | Koyama et al. | 330/252 |
| 5,699,010 | 12/1997 | Hatanaka | 330/252 |
| 5,736,885 | 4/1998 | Wietecha et al. | 330/261 |
| 5,774,019 | 6/1998 | Koyama et al. | 330/252 |

*Primary Examiner*—Robert Pascal
*Assistant Examiner*—Khanh Van Nguyen
*Attorney, Agent, or Firm*—Michael N. Meller

[57] ABSTRACT

First and second input signals are supplied to the bases of first and second input transistors, respectively, and the first and second input transistors output currents in accordance with the first and second input signals, respectively. A resistor provided between the emitter of the first input transistor and the emitter of the second input. transistor generates the differential voltage of the first input signal and the second input signal. First and second constant-current sources supply currents to the collectors of the first and second input transistors, respectively. The collectors of first and second control transistors are connected to the emitters of the first and second input transistors, respectively, and the base voltages of the first and second control transistors are controlled in accordance with the emitter currents of the first and second input transistors, respectively. The bases of first and second output transistors are connected to the bases of the first and second control transistors, respectively, and the first and second output transistors control their collector currents in accordance with the base voltages of the first and second control transistors, respectively.

2 Claims, 4 Drawing Sheets

5,907,260

1

DIFFERENTIAL AMPLIFYING CIRCUIT

BACKGROUND OF THE INVENTION

1. Field of the Invention

The present invention relates to a differential amplifying circuit, and, in particular, to a differential amplifying circuit which outputs a signal in accordance with a difference between two input signals.

2. Description of the Related Art

FIG.1 shows a circuit diagram of an example of a differential amplifying circuit in the related art.

The differential amplifying circuit 1 in the related art outputs an output signal in accordance with the difference between a first input voltage and a second input voltage. The differential amplifying circuit 1 includes NPN transistors Q1 and Q2 which input the first and second input voltages, respectively, a constant-current source 2 which draws a current from the transistors Q1 and Q2 and resistors R1, R2, R3 and R4.

The base of the transistor Q1 is connected to a first input terminal TIN1 to which the first input voltage is applied. The collector of the transistor Q1 is connected to a power source 3 through the resistor R1, and the emitter of this transistor is connected to the constant-current source 2 through the resistor R2. The transistor Q1 draws a current from the collector in accordance with the first input voltage, and supplies the current to the constant-current source 2. A first output terminal TOUT1 is connected between the collector of the transistor Q1 and the resistor Ri, and the output signal in accordance with the first input voltage applied to the base of the transistor Q1 is output to the first output terminal TOUT1.

The base of the transistor Q2 is connected to a second input terminal TIN2 to which the second input voltage is applied. The second input voltage is applied to the transistor Q2 through the second input terminal TIN2. The collector of the transistor Q2 is connected to the power source 3 through the resistor R3, and the emitter of this transistor is connected to the constant-current source 2 through the resistor R4. The transistor Q2 draws a current from the collector in accordance with the second input voltage, and supplies the current to the constant-current source 2 to which the transistor Q1 also supplies the current as mentioned above. A second output terminal TOUT2 is connected between the collector of the transistor Q2 and the resistor R3. The transistor Qi supplies the current in accordance with the first input voltage to the constant-current source 2, and the current drawn from the emitter of the transistor Q2 to the constant-current source 2 is controlled. Thereby, the output voltages in accordance with the difference between the first input voltage and the second input voltage are output.

FIG.2 shows a circuit diagram of one example of a differential amplifying circuit of a low-voltage driving type in the related art. The same reference numerals are given to the parts that are the same as those shown in FIG.1 and the descriptions thereof will be omitted.

Instead of the constant-current source 2, and resistors R2 and R4 of the circuit of FIG.1, in the differential amplifying circuit 11, a constant-current source 4 is connected to the emitter of an NPN transistor Q1, a constant-current source 5 is connected to the emitter of an NPN transistor Q2. A resistor R11 is connected between the connection point of the emitter of the transistor Q1 and the constant-current source 4, and the connection point of the emitter of the transistor Q2 and the constant-current source 5. In the

2 resistor R11, the differential voltage between the first and second input voltages is generated.

In the circuit shown in FIG.2, because the emitter of each of the transistors Q1 and Q2 has no series resistor connected thereto, it is possible to reduce the voltage necessary to drive the circuit.

FIG.3 shows a circuit diagram of one example of a differential amplifying circuit having linear input and output characteristics in the related art. The same reference numerals are given to the parts that are the same as those shown in FIG.2 and the descriptions thereof will be omitted.

In the differential amplifying circuit 21 in the related art which ensures input and output linearity, in addition to the circuit of FIG.2, an NPN transistor Q21 is provided between the emitter of the transistor Q1 and the constant-current source 4, and an NPN transistor Q22 is provided between the emitter of the transistor Q2 and the constant-current source 5. The transistor Q21 controls the emitter current of the transistor Q1 in accordance with the emitter voltage of the transistor Q2. The transistor Q22 controls the emitter current of the transistor Q2 in accordance with the emitter voltage of the transistor Q1.

The collector of the transistor Q21 is connected to the emitter of the transistor Q1, the emitter of the transistor Q21 is connected to the connection point of the constant-current source 4 and the resistor R11, and the base of the transistor Q21 is connected to the emitter of the transistor Q2. The collector of the transistor Q22 is connected to the emitter of the transistor Q2, the emitter of the transistor Q22 is connected to the connection point of the constant-current source 5 and the resistor R11, and the base of the transistor Q22 is connected to the connection point of the emitter of the transistor Q1 and the collector of the transistor Q21.

In the above-described differential amplifying circuit 21, the transistors Q21 and Q22 control the base-emitter voltages VBE of the input and output transistors so that the base-emitter voltages do not vary. Thereby, input and output linearity can be ensured.

In the differential amplifying circuit 1 shown in FIG.1 in the related art, the constant-current source 2 and the resistors R1 and R2 are connected to the transistor Q1 in series, and the constant-current source 2 and the resistors R3 and R4 are connected to the transistor Q2 in series. Therefore, it is not possible to reduce the voltage of the differential amplifying circuit. Further, the base-emitter voltages of the transistors Q1 and Q2 vary in accordance with the input voltages. Thereby, input and output linearity cannot be ensured.

In the differential amplifying circuit 11 of low-voltage driving type in the related art shown in FIG.2, the constant-current source 4 is connected to the emitter of the transistor Q1, the constant-current source 5 is connected to the emitter of the transistor Q2 and the resistor R11 for generating a differential voltage is connected between the emitter of the transistor Q1 and the emitter of the transistor Q2. In this arrangement, the difference occurs between the collector current of the transistor Q1 and the collector current of the transistor Q2, and the differential output is output. In the arrangement, the resistors R2 and R4 connected to the transistors Q1 and Q2 in series, respectively, in the circuit shown in FIG.1 can be eliminated. Thereby, it is possible to reduce the voltage of the differential amplifying circuit. However, similar to the differential amplifying circuit 1 shown in FIG., the base-emitter voltages of the transistors Q1 and Q2 vary in accordance with the input voltages. Thereby, input and output linearity cannot be ensured.

In the differential amplifying circuit 21 having linear input and output characteristics in the related art shown in FIG.3, the base-emitter voltages VBE of the input and output transistors are controlled, and thus input and output linearity is ensured. However, because the two transistors are connected to the power source in series, the differential amplifying circuit 21 is not suitable for reducing the voltage of the circuit.

SUMMARY OF THE INVENTION

The present invention has been devised in consideration of the above-described points. An object of the present invention is to provide a differential amplifying circuit in which circuit voltage reduction can be performed and input and output linearity can be ensured.

A differential amplifying circuit, according to the present invention, comprises:

a first input transistor, a first input signal being supplied to the base of the first input transistor and the first input transistor outputting a current in accordance with the first input signal;

a second input transistor, a second input signal being supplied to the base of the second input transistor and the second input transistor outputting a current in accordance with the second input signal;

a resistance component which is provided between the emitter of the first input transistor and the emitter of the second input transistor, and generates a differential voltage of the first input signal and the second input signal;

a first constant-current source which supplies a current to the collector of the first input transistor;

a second constant-current source which supplies a current to the collector of the second input transistor;

a first control transistor, the collector of which is connected to the emitter of the first input transistor, the base voltage of the first control transistor being controlled in accordance with the emitter current of the first input transistor;

a second control transistor, the collector of which is connected to the emitter of the second input transistor, the base voltage of the second control transistor being controlled in accordance with the emitter current of the second input transistor;

a first output transistor, the base of which is connected to the base of the first control transistor, the first output transistor controlling the collector current in accordance with the base voltage of the first control transistor; and a second output transistor, the base of which is connected to the base of the second control transistor, the second output transistor controlling the collector current in accordance with the base voltage of the second control transistor.

In this arrangement, the base voltages of the first and second control transistors are controlled in accordance with a current flowing through the resistance component. Thereby, change of the base-emitter voltages of the first and second input transistors can be compensated for. Accordingly, a linear output voltage can be obtained with respect to the first and second input signals. Further, the voltage necessary for the operation of the circuit is determined by the voltages applied to the first and second constant-current sources, the voltages applied to the first and second control transistors when each of these transistors is saturated, and the base-emitter voltages of the first and second input transistors. Generally, each of the voltage applied to a constant-current source and the voltage applied to a transistor when the transistor is saturated is 0.1 V, and the base-emitter voltage of a transistor when the transistor is not saturated is 0.6 V. As a result, the circuit can be driven by a low voltage on the order of 0.8 V.

The differential amplifying circuit may further comprise;

a voltage source which generates a bias voltage;

a first current supply transistor, the bias voltage generated by the voltage source being applied to the base of the first current supply transistor, the emitter of the first current supply transistor being connected to the connection point of the first constant-current source and the collector of the first input transistor, the collector of the first current supply transistor being connected to the base of the first control transistor and to the base of the first output transistor; and a second current supply transistor, the bias voltage generated by the voltage source being applied to the base of the second current supply transistor, the emitter of the second current supply transistor being connected to the connection point of the second constant-current source and the collector of the second input transistor, the collector of the second current supply transistor being connected to the base of the second control transistor and to the base of the second output transistor.

Other objects and further features of the present invention will become more apparent from the following detailed description when read in conjunction with the accompanying drawings.

DETAILED DESCRIPTION OF THE PREFERRED EMBODIMENT

Figure 1:
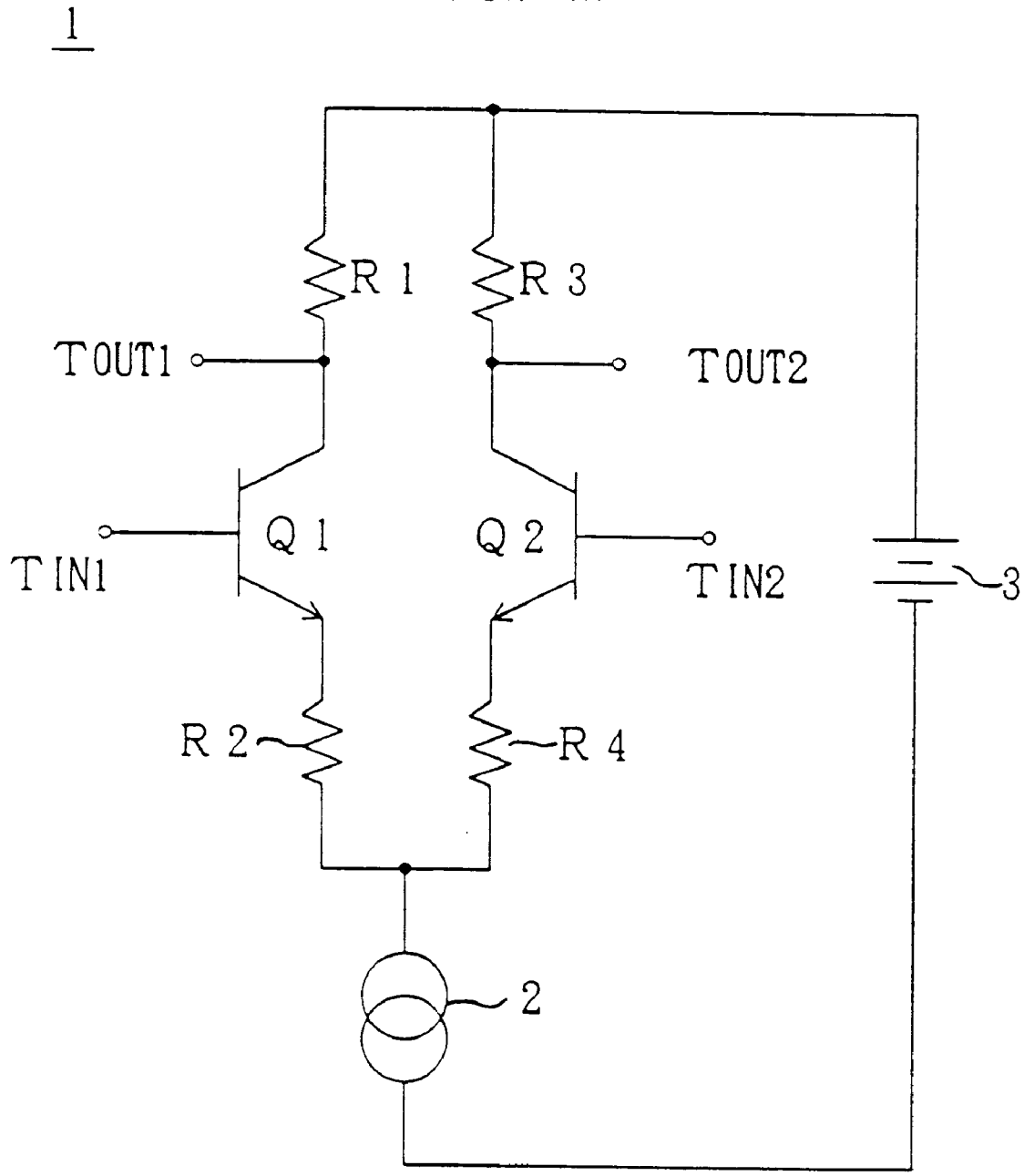
FIG. 1 shows a circuit diagram of one example of a differential amplifying circuit in the related art.
Figure 2:
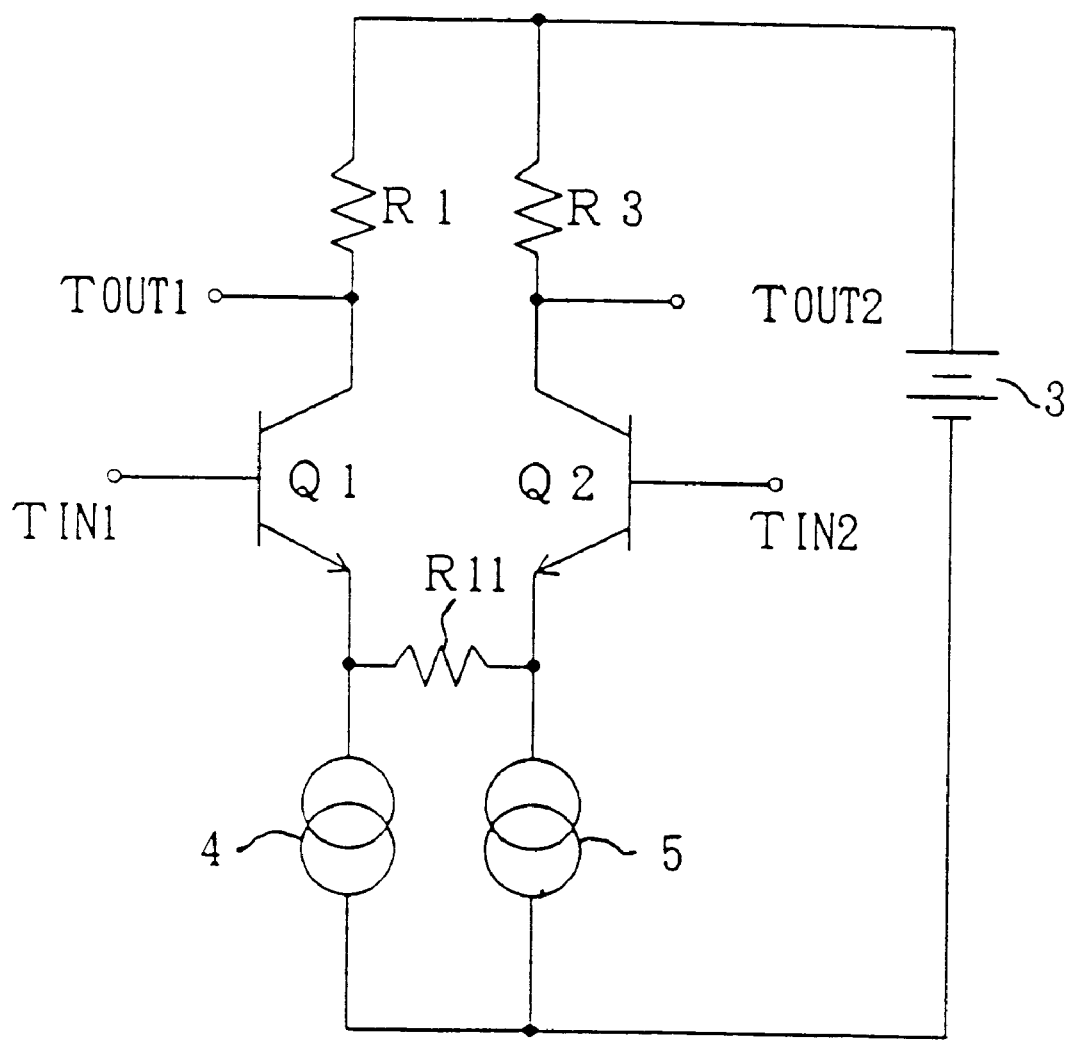
FIG. 2 shows a circuit diagram of one example of a differential amplifying circuit of a low-voltage driving type in the related art.
Figure 3:
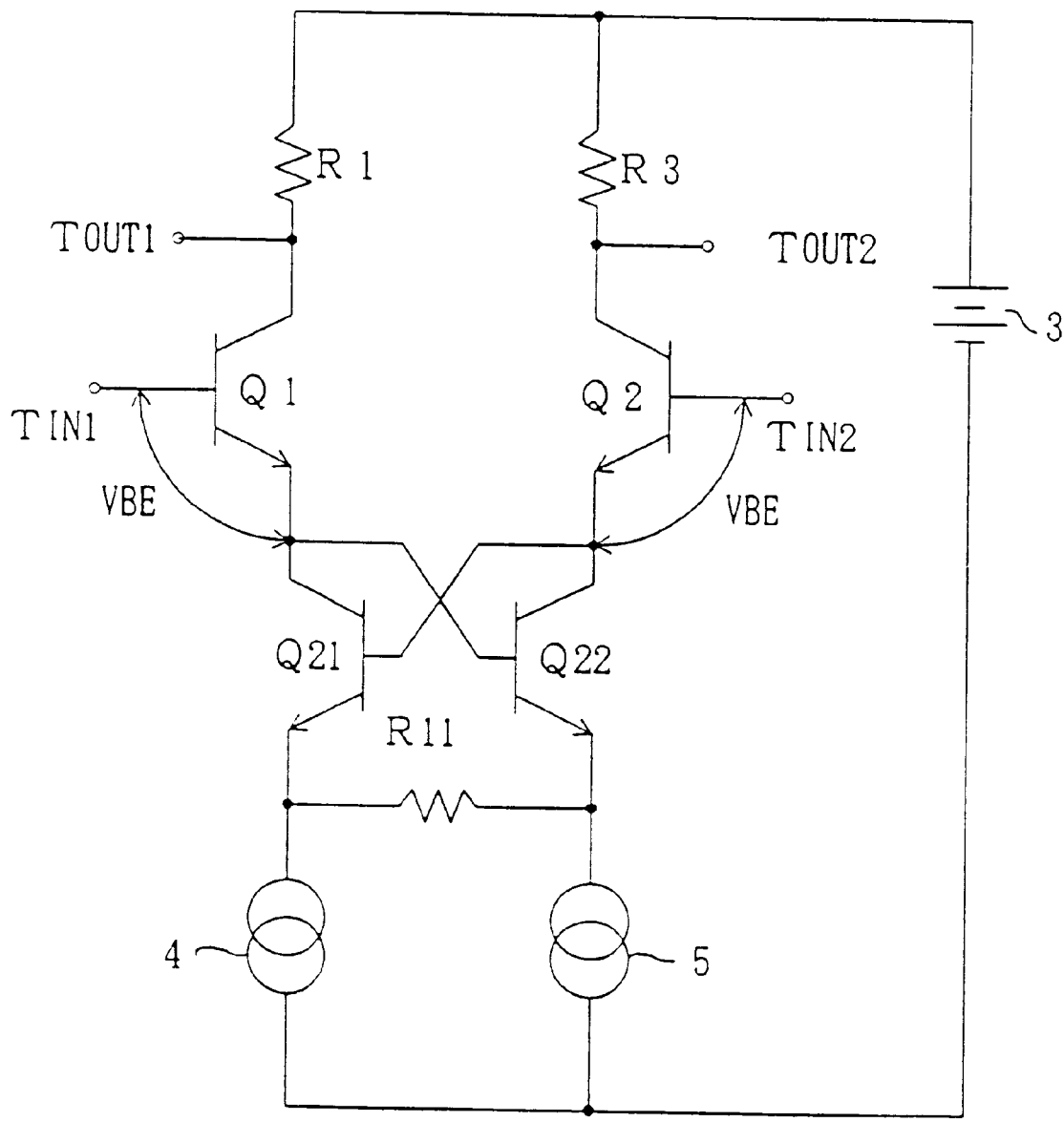
FIG. 3 shows a circuit diagram of one example of a differential amplifying circuit having linear input and output characteristics in the related art.
Figure 4:
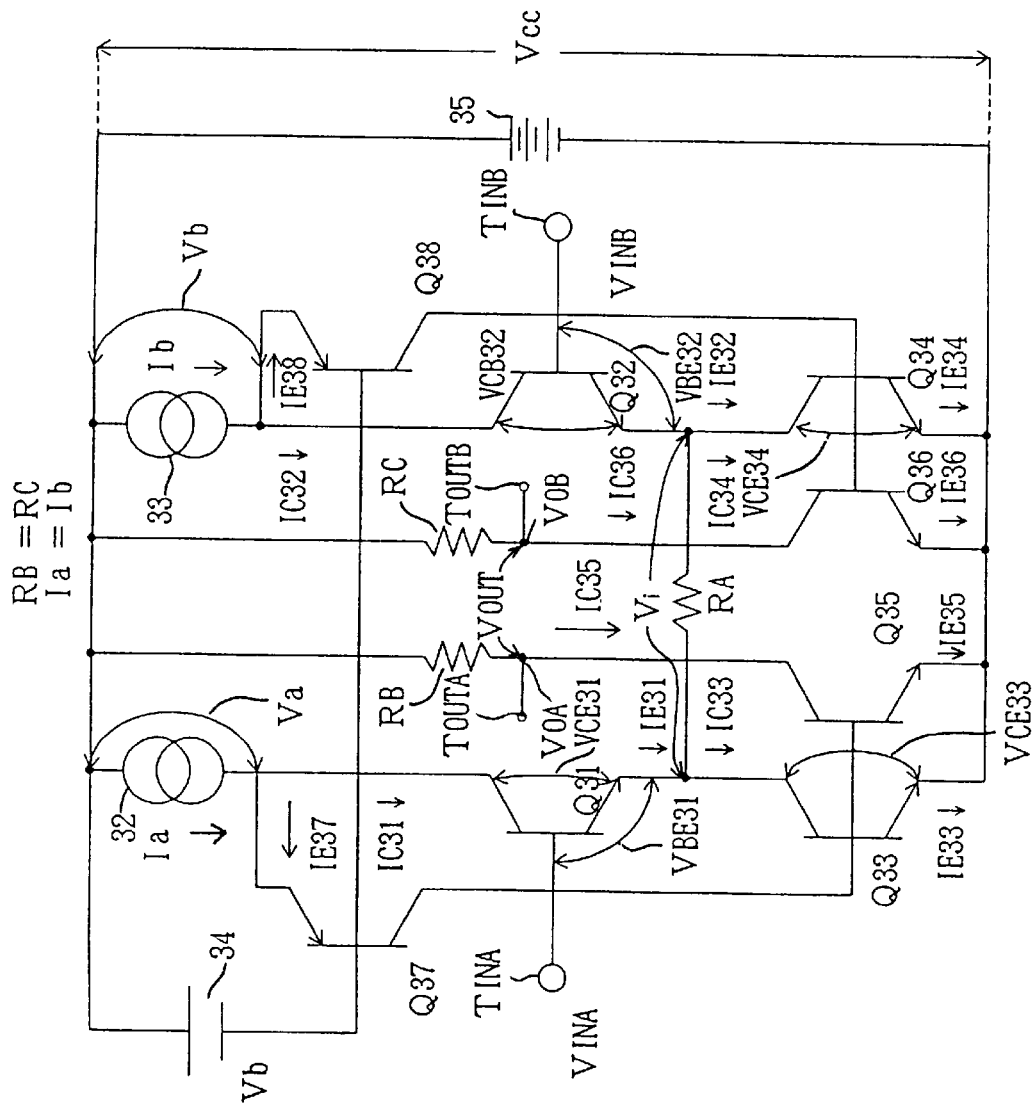
FIG. 4 shows a circuit diagram of a differential amplifying circuit in one embodiment of the present invention.

FIG.4 shows a circuit diagram of a differential amplifying circuit in one embodiment of the present invention.

The differential amplifying circuit 31 in the embodiment includes a constant-current source 32 acting as a first constant-current source, a constant-current source 33 acting as a second constant-current source, an NPN transistor Q31 acting as a first input transistor, an NPN transistor Q32 acting as a second input transistor, an NPN transistor Q33 acting as a first control transistor, an NPN transistor Q34 acting as a second control transistor, an NPN transistor Q35 acting as a first output transistor, an NPN transistor Q36 acting as a second output transistor, a PNP transistor Q37 acting as a first current supply transistor, a PNP transistor Q38 acting as a second current supply transistor, a differential voltage generating resistor RA acting as a resistance component, output resistors RB, RC for outputting output voltages, a constant-voltage source 34 acting as a voltage source which applies bias to the bases of the first and second current supply transistors, and a driving power source 35 which drives the circuit.

The base of the transistor Q31 is connected to a first input terminal TINA. A first input voltage VINA acting as a first input signal is applied to the first input terminal TINA. The first input voltage VINA controls the base voltage of the transistor Q31.

The collector of the transistor Q31 is connected to one end of the constant-current source 32. The other end of the constant-current source 32 is connected to the positive-voltage side terminal of the driving power source 35. The constant-current source 32 generates a constant current Ia from a voltage Vcc supplied by the driving power source 35 and supplies the constant current Ia to the collector of the transistor Q31.

The emitter of the transistor Q31 is connected to the collector of the transistor Q33 and to one end of the differential voltage generating resistor RA. The emitter of the transistor Q33 is connected to the negative-voltage side terminal of the driving power source 35, the base of this transistor is connected to the collector of the transistor Q37. The transistor Q33 controls the emitter current of the transistor Q31 in accordance with the collector voltage of the transistor Q37.

The base of the transistor Q37 is connected to the negative-voltage side terminal of the constant-voltage source 34. The constant-voltage source 34 is formed of a resistor or the like. The positive-voltage side terminal of the constant-voltage source 34 is connected to the positive-voltage side terminal of the driving power source 35 and the negative-voltage side terminal of the constant-voltage source 34 is connected to the base of the transistor Q37. The constant-voltage source 34 applies a bias voltage Vb to the base of the transistor Q37 so that the transistor Q37 is saturated.

The emitter of the transistor Q37 is connected to the connection point of the constant-current source 32 and the collector of the transistor Q31. The constant current Ia generated by the constant-current source 32 is distributed and the distributed current is supplied to the transistor Q37. The emitter current IE37 of the transistor Q37 is expressed as follows: IE37=Ia−IC31, where IC31 represents the collector current of the transistor Q31. Therefore, the emitter current IE37 is controlled in accordance with the collector current IC31 of the transistor Q31, that is, in accordance with the first input voltage VINA.

When the base voltage of the transistor Q31 rises, the emitter current IE31 of this transistor increases. The emitter current IE31 of the transistor Q31 is supplied to the resistor RA. The collector current IC33 of the transistor Q33 is obtained as follows:

IC33=Ia−IRA, where IRA represents the current flowing through the resistor RA. Further, because IE37<<Ia and IC31≈IE31, IE31≈Ia. Here, it is assumed that IE31=Ia.

At this time, the base current of the transistor Q33, that is, the collector current IC37 of the transistor Q37, is obtained as follows:

$$IC37 = \frac{2(Ia - IRA)}{hFE} \quad (1)$$

When no voltage difference exists between the two ends of the resistor RA, $$IC37 = \frac{2Ia}{hFE} \quad (2)$$

The collector current IC37 of the transistor Q37 includes the base current of the transistor Q35.

When the collector current IC37 of the transistor Q37 decreases in the amount corresponding to the current IRA flowing through the resistor RA, the base voltage VB33 of the transistor Q33 decreases in the amount corresponding to the current IRA flowing through the resistor RA.

At this time, the decreased amount ΔVB33 of the base voltage VB33 of the transistor Q33 is obtained as follows:

$$\Delta VB33 = \frac{kT}{q} \cdot \ln\left(\frac{IRA}{Ia}\right) \quad (3)$$

The collector current IC37 of the transistor Q37 mentioned in the equation (1) is very small in comparison to the constant current Ia. Thereby, change of the collector current IC31 of the transistor Q31 is very small. Thereby, change of the base-emitter voltage VBE31 of the transistor Q31 is very small. Accordingly, it is possible to control the emitter voltage of the transistor Q31 linearly.

Further, the collector of the transistor Q37 is also connected to the base of the transistor Q35. Thereby, the collector current IC35 of the transistor Q35 is controlled in accordance with the collector current IC37 of the transistor Q37. The emitter of the transistor Q35 is connected to the negative-voltage side terminal of the driving power source 35 and the collector of this transistor is connected to one end of the output resistor RB.

The other end of the output resistor RB is connected to the positive-voltage side terminal of the driving power source 35. Further, an output terminal TOUTA is connected to the connection point of the output resistor RB and the collector of the transistor Q35. A first output voltage VOA is output from the output terminal TOUTA.

The base of the transistor Q32 is connected to a second input terminal TINB. A second input voltage VINB acting as a second input signal is applied to the second input terminal TINB. The second input voltage VINB controls the base voltage of the transistor Q32.

The collector of the transistor Q32 is connected to one end of the constant-current source 33. The other end of the constant-current source 33 is connected to the positive-voltage side terminal of the driving power source 35. The constant-current source 33 generates a constant current Ib from the voltage Vcc supplied by the driving power source 35 and supplies the constant current Ib to the collector of the transistor Q32.

The emitter of the transistor Q32 is connected to the collector of the transistor Q34 and to the other end of the differential voltage generating resistor RA. The emitter of the transistor Q34 is connected to the negative-voltage side terminal of the driving power source 35, the base of this transistor is connected to the collector of the transistor Q38. The transistor Q34 controls the emitter current of the transistor Q32 in accordance with the collector voltage of the transistor Q38.

The base of the transistor Q38 is connected to the negative-voltage side terminal of the constant-voltage source 34. Similar to the transistor Q37, the constant-voltage source 34 applies the bias voltage Vb to the base of the transistor Q38 so that the transistor Q38 is saturated.

The emitter of the transistor Q38 is connected to the connection point of the constant-current source 33 and the collector of the transistor Q32. The constant current Ib generated by the constant-current source 33 is distributed and the distributed current is supplied to the transistor Q38. The emitter current IE38 of the transistor Q38 is expressed as follows: IE38=Ib−IC32, where IC32 represents the collector current of the transistor Q32. Therefore, the emitter current IE38 is controlled in accordance with the collector current IC32 of the transistor Q32, that is, in accordance with the-first input voltage VINB.

At this time, similar to the transistor Q31, when the base voltage of the transistor Q32 rises, the emitter current IE32 of this transistor increases. The emitter current IE32 of the transistor Q32 is supplied to the resistor RA. The collector current IC34 of the transistor Q34 is obtained as follows:

IC34=Ib−IRA, where IRA represents the current flowing through the resistor RA. Further, because IE38<<Ib and IC32≈IE32, IE32≈Ib. Here, it is assumed that IE32=Ib.

At this time, the base current of the transistor Q34, that is, the collector current IC38 of the transistor Q38 is obtained as follows:

$$IC38 = \frac{2(Ib - IRA)}{hFE} \quad (4)$$

When no voltage difference exists between the two ends of the resistor RA, $$IC38 = \frac{2Ib}{hFE} \quad (5)$$

The collector current IC38 of the transistor Q38 includes the base current of the transistor Q36.

When the collector current IC38 of the transistor Q38 decreases in the amount corresponding to the current IRA flowing through the resistor RA, the base voltage VB34 of the transistor Q34 decreases in the amount corresponding to the current IRA flowing through the resistor RA.

At this time, the decreased amount ΔVB34 of the base voltage VB34 of the transistor Q34 is obtained as follows:

$$\Delta VB34 = \frac{kT}{q} \cdot \ln\left(\frac{IRA}{Ib}\right) \quad (6)$$

The collector current IC38 of the transistor Q38 mentioned in the equation (4) is very small in comparison to the constant current Ib. Thereby, change of the collector current IC32 of the transistor Q32 is very small. Thereby, change of the baseemitter voltage VBE32 of the transistor Q32 is very small. Accordingly, it is possible to control the emitter voltage of the transistor Q32 linearly.

Further, the collector of the transistor Q38 is also connected to the base of the transistor Q36. Thereby, the collector current IC36 of the transistor Q36 is controlled in accordance with the collector current IC38 of the transistor Q38. The emitter of the transistor Q36 is connected to the negative-voltage side terminal of the driving power source 35 and the collector of this transistor is connected to one end of the output resistor RC.

The other end of the output resistor RC is connected to the positive-voltage side terminal of the driving power source 35. Further, an output terminal TOUTB is connected to the connection point of the output resistor RC and the collector of the transistor Q36. A second output voltage VOB is output from the output terminal TOUTB.

Operations of the differential amplifying circuit 31 in the embodiment will now be described.

The emitter current IE31 of the transistor Q31 is expressed by the following equation:

$$IE31 \approx Ia \cdot \left\{1 - \left(\frac{1}{hFE33} + \frac{1}{hFE33 \cdot hFE35}\right) - \left(\frac{1}{hFE37(hFE33 + hFE35)}\right)\right\} \quad (7)$$

In the equation, Ia represents the constant current generated by the constant-current source 32, hFE33 represents the current amplification factor of the transistor Q33, hFE35 represents the current amplification factor of the transistor Q35, hFE37 represents the current amplification factor of the transistor Q37. Further, it is assumed that the current IRA flowing through the resistor RA is 0 ampere. Generally, a current amplification factor hFE of a transistor is set to be a sufficiently large value of tens to hundreds. Accordingly, assuming that each of the current amplification factors hFE33, hFE35, hFE37 of the transistors Q33, Q35 and Q37 is sufficiently large, the terms of the current amplification factors hFE33, hFE35, hFE37 are approximately 0 as follows:

$$-\left(\frac{1}{hFE33} + \frac{1}{hFE33 \cdot hFE35}\right) - \left(\frac{1}{hFE37(hFE33 + hFE35)}\right) \approx 0 \quad (8)$$

Accordingly, as a result of substitution of the equation (8) into the equation (7), the emitter current IE31 of the transistor Q31 is expresses as follows:

$$IE31 \approx Ia \quad (9)$$

Further, similarly, the emitter current IE32 of the transistor Q32 is expressed as follows:

$$IE32 \approx Ib \quad (10)$$

The currents relating to the current amplification factors hFE33, hFE35, hFE34 and hFE36 change in accordance with the current IRA flowing through the resistor RA. However, because each of these changes is very small, the relationships of the equations (9) and (10) are approximately fixed when the first and second input voltages VINA and VINB are such that VINA is equal to VINB and also when the first and second input voltages VINA and VINB are such that VINA is not equal to VINB.

When the input voltages VINA and VINB are applied to the first and second input terminals TINA and TINB, respectively, the transistor Q31 turns on in response to the first input voltage VINA supplied to the first input terminal TINA. Accordingly, the emitter current IE31 in accordance with the first input voltage VINA flows. Similarly, the transistor Q32 turns on in response to the second input voltage VINB supplied to the second input terminal TINB. Accordingly, the emitter current IE32 in accordance with the first input voltage VINB flows.

Thereby, in the differential voltage generating resistor RA, which is connected between the emitter of the transistor Q31 and the emitter of the transistor Q32, the voltage Vi corresponding to the differential voltage (VINA-VINB) between the first input voltage VINA and the second input voltage VINB precisely occurs.

At this time, the emitter current IE33 of the transistor Q33 is expressed as follows:

$$IE33 = IE31 - \frac{Vi}{RA} \qquad (11)$$

Similarly, the emitter current IE34 of the transistor Q34 is expressed as follows:

$$IE34 = IE32 + \frac{Vi}{RA} \qquad (12)$$

Because the transistors Q33 and Q35 form a current-mirror circuit, $$IE33 = IE35 = IC35 \qquad (13)$$

The first output voltage VOA is expressed as follows:

$$VOA = Vcc - RB \cdot IC35 = Vcc - RB \cdot IE33 \qquad (14)$$

As a result of substitution of the equation (11) into the equation (14), $$VOA = Vcc - \left(RB \cdot IE31 - \frac{RB \cdot Vi}{RA}\right) \qquad (15)$$

Similarly, because the transistors Q34 and Q36 form a current-mirror circuit, $$IE34 = IE36 = IC36 \qquad (16)$$

The second output voltage VOB is expressed as follows:

$$VOB = Vcc - RC \cdot IC36 = Vcc - RC \cdot IE34 \qquad (17)$$

As a result of substitution of the equation (12) into the equation (17), $$VOB = Vcc - \left(RC \cdot IE32 + \frac{RC \cdot Vi}{RA}\right) \qquad (18)$$

It is assumed that an output voltage VOUT is expressed as follows:

$$VOUT = VOA - VOB \qquad (19)$$

Further, it is assumed that Ia=Ib. From the equations (9) and (10), it is also assumed that IE31=Ia and IE32=Ib. When substitution of the equations (15) and (18) into the equation (19) is performed, $$VOUT = Vcc - \left(RB \cdot Ia - \frac{RB \cdot Vi}{RA}\right) - \left\{Vcc - \left(RC \cdot IE32 + \frac{RC \cdot Vi}{RA}\right)\right\} \qquad (20)$$

$$= \left(\frac{RB + RC}{RA}\right) \cdot Vi$$

As shown in the equation (20), the output voltage VOUT in accordance with the voltage Vi corresponding to the differential voltage between the first input voltage VINA and the second input voltage VINB is output between the first output terminal TOUTA and the second output terminal TOUTB.

Thus, in this embodiment, by the transistors Q33, Q34, Q37 and Q38, the emitter current IE31 of the transistor Q31 and the emitter current IE32 of the transistor Q32 are controlled to be equal to the constant currents Ia and Ib, respectively. Thereby, it is possible that, independent of the first and second input voltages VINA and VINB, each of the base-emitter voltages VBE31 and VBE32 of the transistors Q31 and Q32 is fixed. Accordingly as shown in the equation (20), it is possible that the output differential voltage VOUT, which is the differential voltage between the first and second output voltages VOA and VOB, has linear characteristics with respect to the input differential voltage Vi which corresponds to the differential voltage between the first and second input voltages VINA and VINB.

Further, at this time, the minimum driving voltage Vcc required for driving the circuit with the driving power source 35 is expressed as follows:

$$Vcc = VCE31 + VCE33 + Va, \text{ or } Vcc = VCE32 + VCE34 + Vb \qquad (21)$$

In the above equations, VCE31 and VCE32 represent the collector-emitter voltages of the transistors Q31 and Q32, respectively, VCE33 and VCE34 represent the collector-emitter voltages of the transistors Q33 and Q34, respectively, Va and Vb represent the voltages of the constant-current sources 32 and 33, respectively.

At this time, because the transistors Q33 and Q34 and the constant-current sources 32 and 33 are driven in the saturation conditions, each of the collector-emitter voltages VCE33 and VCE34 of the transistors Q33 and Q34 is usually on the order of approximately 0.1 V. It is assumed that the transistors Q31 and Q32 operate ordinarily. It is also assumed that each of the collector-emitter voltages VCE31 and VCE32 of the transistors Q31 and Q32 is on the order of approximately 0.6 V. Then, substitution of these values into the equation (21). Then, the driving voltage Vcc is expressed as follows:

$$Vcc = 0.6 + 0.1 + 0.1 = 0.8(V) \qquad (22)$$

Thus, driving of the circuit with a low voltage on the order of 0.8 V can be possible.

Thus, in this embodiment, it is possible to drive the circuit so that the output voltage is linear with respect to the input voltage, and also, it is possible to drive the circuit with a low voltage on the order of 0.8 V.

In this embodiment, the current Ia and Ib generated by the constant-current sources 32 and 33 are such that Ia is equal to Ib, and the output resistors RB and RC are such that RB is equal to RC. However, similar functions can be obtained when the currents Ia and Ib are such that Ia is not equal to Ib, and the output resistors RB and RC are such that RB is not equal to RC.

Further, in this embodiment, the gain can be easily adjusted as a result of only changing the emitter areas of the transistors Q33, Q34, Q35 and Q36.

Further, the loads of the transistors Q35 and Q36 are not necessarily resistors. It is also possible to use active loads instead of the resistors.

In this embodiment, the emitters of the transistors Q33, Q34, Q35 and Q36 are directly connected to the negative-voltage side terminal of the driving power source 35, and thereby the driving voltage Vcc of the driving power source 35 can be reduced. However, it is also possible to make these connections through resistors, and thereby, it is possible to reduce the Early effect.

Further, similar functions can be obtained by adding leakage absorption resistors to the circuit.

Further, in this embodiment, the first and second input transistors, first and second control transistors and first and second output transistors are the NPN transistors, and the current supply transistors are the PNP transistors. However, it is also possible that the first and second input transistors, first and second control transistors and first and second output transistors are the PNP transistors, the current supply transistors are the NPN transistors, and the polarity of the driving voltage is inverted. In this arrangement, similar functions can be obtained.

Further, the present invention is not limited to the above-described embodiment, and variations and modifications may be made without departing from the scope of the present invention claimed in the following claims.

What is claimed is:

1. A differential amplifying circuit, comprising:

a first input transistor, a first input signal being supplied to the base of said first input transistor and said first input transistor outputting a current in accordance with said first input signal;

a second input transistor, a second input signal being supplied to the base of said second input / transistor and said second input transistor outputting a current in accordance with said second input / signal;

a resistance component which is provided between the emitter of said first input transistor and the emitter of said second input transistor, and generates a differential voltage of said first input signal and said second input signal;

a first constant-current source which supplies a current to the collector of said first input transistor;

a second constant-current source which supplies a current to the collector of said second input transistor;

a first control transistor, the collector of which is connected to the emitter of said first input transistor, the base voltage of said first control transistor being controlled in accordance with the emitter current of said first input transistor;

a second control transistor, the collector of which is connected to the emitter of said second input transistor, the base voltage of said second control transistor being controlled in accordance with the emitter current of said second input transistor;

a first output transistor, the base of which is connected to the base of said first control transistor, said first output transistor controlling its collector current in accordance with the base voltage of said first control transistor;

a second output transistor, the base of which is connected to the base of said second control transistor, said second output transistor controlling its collector current in accordance with the base voltage of said second control transistor;

a voltage source which generates a bias voltage;

a first current supply transistor, the bias voltage generated by said voltage source being applied to the base of said first current supply transistor, the emitter of said first current supply transistor being connected to the connection point of said first constant-current source and the collector of said first current supply transistor being connected to the base of said first control transistor and to the base of said first output transistor; and a second current supply transistor; the bias voltage generated by said voltage source being applied to the base of said second current supply transistor, the emitter of said second current supple transistor being connected to the connection point of said second constant-current source and the collector of said second input transistor, the collector of said second current supply transistor being connected to the base of said second control transistor and to the base of said second output transistor.

2. A differential amplifying circuit, comprising:

a first NPN transistor, a first input signal being supplied to the base of said first NPN transistor and said first NPN transistor outputting a current in accordance with said first input signal;

a second NPN transistor, a second input signal being supplied to the base of said second NPN transistor and said second NPN transistor outputting a current in accordance with said second input signal;

a resistor which is provided between the emitter of said first NPN transistor and the emitter of said second NPN transistor, and generates the differential voltage of said first input signal and said second input signal;

a first constant-current source which supplies a current to the collector of said first NPN transistor;

a second constant-current source which supplies a current to the collector of said second NPN transistor;

a third NPN transistor, the collector of which is connected to the emitter of said first NPN transistor, the base voltage of said third NPN transistor being controlled in accordance with the emitter current of said first NPN transistor;

a fourth NPN transistor, the collector of which is connected to the emitter of said second NPN transistor, the base voltage of said fourth NPN transistor being controlled in accordance with the emitter current of said second NPN transistor;

a fifth NPN transistor, the base of which is connected to the base of said third NPN transistor, said fifth NPN transistor controlling its collector current in accordance with the base voltage of said third NPN transistor;

a sixth NPN transistor, the base of which is connected to the base of said fourth NPN transistor, said sixth NPN transistor controlling its collector current in accordance with the base voltage of said fourth NPN transistor;

a voltage source which generates a bias voltage;

a first PNP transistor, the bias voltage generated by said voltage source being applied to the base of said first PNP transistor, the emitter of said first PNP transistor being connected to the connection point of said first constant-current source and the collector of said first NPN transistor, the collector of said first PNP transistor being connected to the base of said third NPN transistor and to the base of said fifth NPN transistor; and a second PNP transistor, the bias voltage generated by said voltage source being applied to the base of said second PNP transistor, the emitter of said second PNP transistor being connected to the connection point of said second constant-current source and the collector of said second NPN transistor, the collector of said second PNP transistor being connected to the base of said fourth NPN transistor and to the base of said sixth NPN transistor.

* * * * *